United States Patent
Tantraporn

[11] Patent Number: 5,576,533
[45] Date of Patent: Nov. 19, 1996

[54] CIRCUIT FOR CONVERTING SOLAR ENERGY INTO AC POWER

[75] Inventor: Wirojana Tantraporn, Bangkok, THX

[73] Assignee: Premier Global Corporation Ltd., Bangkok, THX

[21] Appl. No.: 323,816

[22] Filed: Oct. 17, 1994

[51] Int. Cl.⁶ .................................................. H01J 40/14
[52] U.S. Cl. .................. 250/214 R; 250/214.1; 363/98; 323/906
[58] Field of Search .......... 250/214 R, 214 SG, 250/214.1, 214 RC, 216; 363/98, 132, 27, 17; 323/906; 204/196, 197; 136/291, 293; 315/86; 307/64

[56] References Cited

U.S. PATENT DOCUMENTS

| | | | |
|---|---|---|---|
| 4,075,034 | 2/1978 | Butler | 136/89 |
| 4,445,049 | 4/1984 | Steigerwald | 323/906 |
| 4,742,291 | 5/1988 | Bobier et al. | 320/39 |
| 5,084,664 | 1/1992 | Gali | 323/906 |

FOREIGN PATENT DOCUMENTS 1016998  9/1977  Canada.

*Primary Examiner*—Que T. Le
*Attorney, Agent, or Firm*—Blakely, Sokoloff, Taylor & Zafman

[57] ABSTRACT

A circuit for converting solar energy into ac power for supplementary household power has a number of solar photovoltaic cells connected in parallel in groups, with the various groups connected in series (30), and a bridge arrangement of four switching devices (31, 32, 33, 34) each operated to pass current in one direction, with the series-connected groups of cells (30) connected between positive and negative bridge terminals (1, 2), and means for connecting the bridge arms (3, 4) across the primary coils of a transformer (312), with the secondary coils thereof connected to the switching devices to control the phase of passed current, the output at the bridge arms (3, 4) being connectable to the household ac.

8 Claims, 5 Drawing Sheets

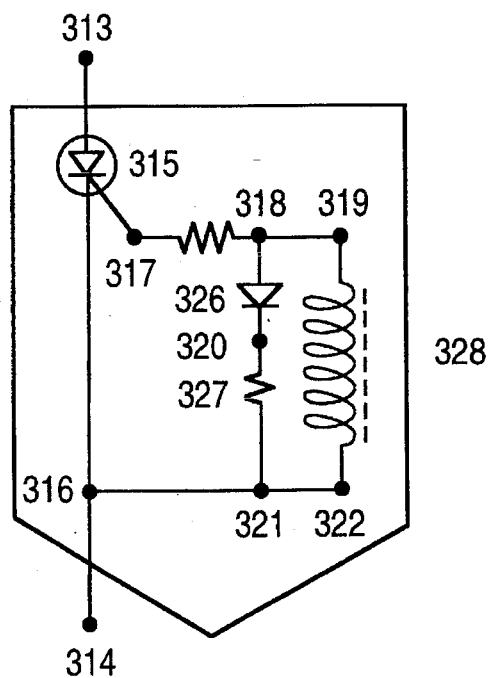
FIG. 7
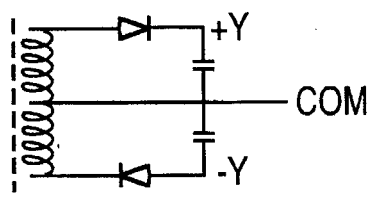
FIG. 8
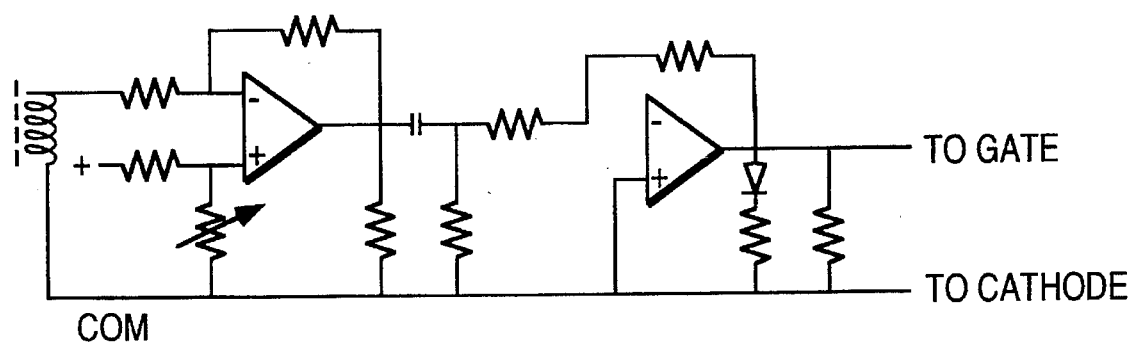

5,576,533

CIRCUIT FOR CONVERTING SOLAR ENERGY INTO AC POWER

FIELD OF THE INVENTION

The present invention relates to an adaptor for converting solar energy into ac to supplement household ac.

DESCRIPTION OF THE PRIOR ART

The conversion of solar energy into electricity via available technologies so far has not been economically feasible except in exceptional, limited, applications. The solid-state photovoltaic cells or solar cells, which are user-convenient, are used 1) more conventionally in conjunction with storage batteries and thus as a dc power supply at hand or for later use, and 2) in conjunction with an inverter circuit to provide ac power into the (household) power line. These and other applications have been well known to those with solar cell concerns.

Beside the still rather high cost of the solar cells themselves the costs of the batteries and/or circuits required do make the system cost of the solar-to-electricity applications out of the consumers' reach. Typical costs for solar cells are still in $10 per kilowatt range. The batteries and circuits' costs generally are more than that of the solar cells. There have been many attempts to produce cells with higher efficiency and less expensive, and projection of cost around $5/KW has been made.

The inverter generally is designed to operate starting with a dc voltage source. Thus the solar cell output is stored/regulated by a battery or at least a very large capacitor. An electronic chopper then provides the chopped dc to be stepped up to the desired voltage via a transformer or a series of voltage doublers. A pulse-shaping circuit then shapes the amplified chopped voltage into a desired sine wave, say a 220 volt ac. (The circuit portion, from the batteries to this ac output, is now commonly used as part of an Un-interrupted Power Supply or UPS. The latter includes an additional rectifying or converter section which converts household ac power into dc for charging the batteries). To provide power into the ac municipal power lines the sinusoidal wave then must be phase-synchronized with the power line such that the latter absorbs the ac power. The said sequence is depicted in FIG. 1.

It is to be noted that the electrical energy from the solar cells must undergo many steps of transformation, and each step cannot have 100% efficiency. Thus the many steps involved not only incur higher cost but also result in poor efficiency. Some of the losses are in providing the energy necessary to effect the functioning of the chopper, amplifier, shaper and synchronizer circuits.

Reference 1, a Canadian patent issued in 1977 with a "Japanese priority date" 1973, represents an earlier version of the UPS using SCR as chopping switches, time-controlled by a central logic circuit. Pulse shaping is accomplished using inductor-capacitor tuned loads, and amplification is via a transformer. To reduce harmonics and afford better phase control more sophisticated chopping and pulse-shaping techniques have been introduced, such as in References 2 and 3. Some circuits are very complicated but the essential functions as described in FIG. 1 remain the same or with only slight modifications. Our new invention to be described below is not intended to serve as a UPS, but rather as a supplemental ac power controlled by and fed into a "live" ac power line, employing solar power in the most efficient and least expensive way.

SUMMARY OF THE INVENTION

The present invention provides A circuit for converting solar energy into ac power supplementary to household ac power, comprising the combination of a plurality of solar photovoltaic cells chosen to be as nearly identical as possible means for connecting said cells in parallel in one or more groups of a certain number of cells each group having a group short-circuit current, such that when illuminated that group's short-circuit current exceeds a value of application interest; means for connecting said groups of parallel-connected cells in series of forming an ensemble such that the open-circuit voltage of the ensemble is 5–20% greater than the absolute value of a peak voltage of the household ac power; four units of switching devices each of which can be operated to pass a current in one directing and having a positive and negative electrode, the units being connected in a bridge configuration in which the positive electrodes of the two units are electrically connected at a second terminal, and in which one unit of said two units is connected to one unit of said other two units, through a third terminal, the other unit of said two units being connected to the other unit of said other two units through a fourth terminal; means for connecting the ensemble comprising the series connected groups of parallel solar cells to said bridge with the positive voltage terminal of the ensemble connected to the first bridge terminal and the negative voltage terminal of the ensemble connected to the second bridge terminal; an isolation transformer having a primary coil and a pair of input terminals and at least four low voltage secondary output coils which are insolated from one another and from the primary coil each having a pair of output terminals; means for connecting the third and fourth terminals of said bridge to the terminals of the primary coils of the transformer; means for connecting the same terminals of the primary coil of said isolation transformer to a plug which can be plugged into the ac power line; and means for connecting the output terminals of each secondary coil across a pair of control electrodes of the switching devices such that in use the voltages on the control electrodes of devices on the opposite arms of the bridge have the same ac phase as each other and a phase which is 180° different from the ac phase on the control electrodes of the other two switching devices on adjacent arms of the bridge.

BRIEF DESCRIPTION OF THE DRAWINGS

FIG. 7 is a schematic detail of a directional switching unit as depicted in FIG. 6.

FIG. 8 is another version of a gate drive circuit to effect stiffer turning on and off of the SCR.

DESCRIPTION OF THE PREFERRED EMBODIMENTS OF THE INVENTION

Figure 1:
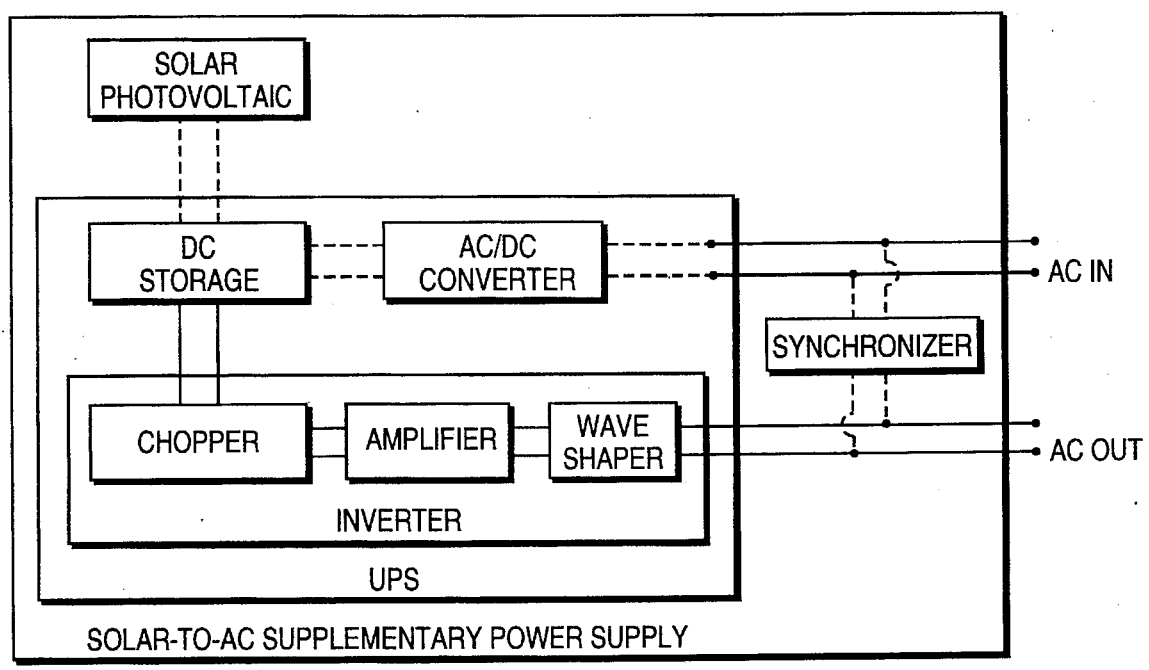
FIG. 1 is a functional block diagram representing the prior art inverter converter approach to convert a dc voltage source to function as a ac power supply supplementary to the household line.

Turning to the Figures, FIG. 1 represents the qualitative description of the state-of-the-art technique for using solar photovoltaic power as a power supplement to the ac power system and should be self-explanatory.

Figure 2:
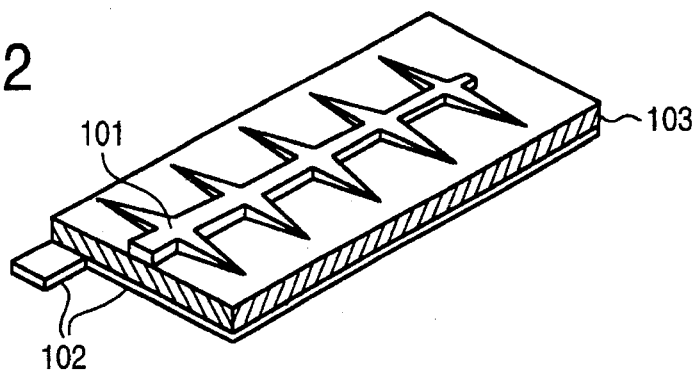
FIG. 2 is a depiction of a photovoltaic cell.

FIG. 2 is a qualitative depiction of a photovoltaic cell consisting of a semiconductor cell body layer 103 designed according to the solar-cell state-of-the-art, with a patterned top metal electrode 101 and a back metal electrode 102.

Figure 3:
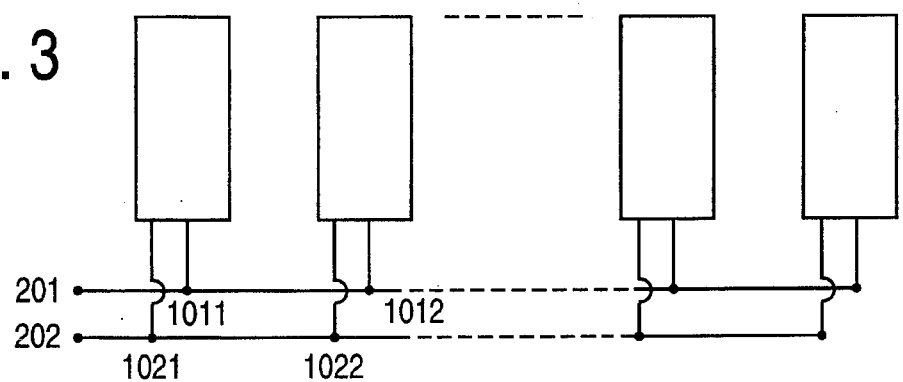
FIG. 3 is a schematic representation of several photovoltaic cells connected in parallel.

FIG. 3 is a schematic representation of several photovoltaic cells, having the top and bottom electrode labelled 1011 and 1021 for cell number 1, 1012 and 1022 for cell number 2, . . . etc., connected in parallel to form a compound cell with electrodes 201, 202.

Figure 4:
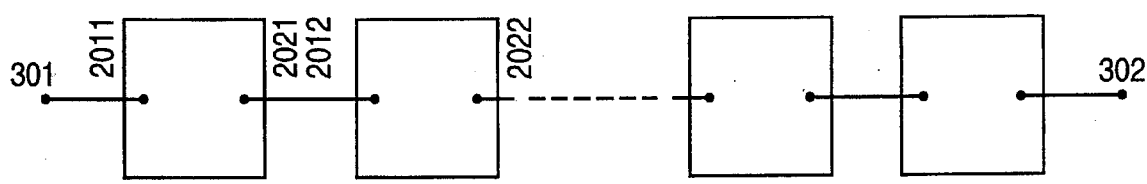
FIG. 4 is a schematic representation of several photovoltaic cells connected in series.

FIG. 4 is a schematic representation of several compound cells of FIG. 3, having the top and bottom electrodes 2011 and 2021 for the first compound cell, 2012 and 2022 for the second compound cell, . . . etc., connected in series to form an ensemble with the electrodes 301, 302.

Figure 5:
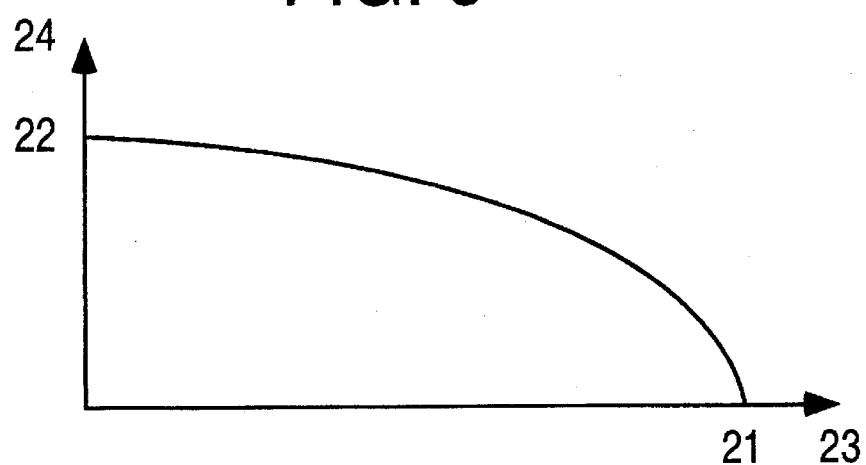
FIG. 5 is a qualitative current-voltage (I–V) characteristic of solar photovoltaic "battery" or solar cell.

FIG. 5 shows the current-voltage (I–V) characteristic of the ensemble described in FIG. 4 with I along the y-axis 24 and V along the x-axis 23 and showing a characteristic short-circuit current at 22 and the open-circuit voltage at 21.

Figure 6:
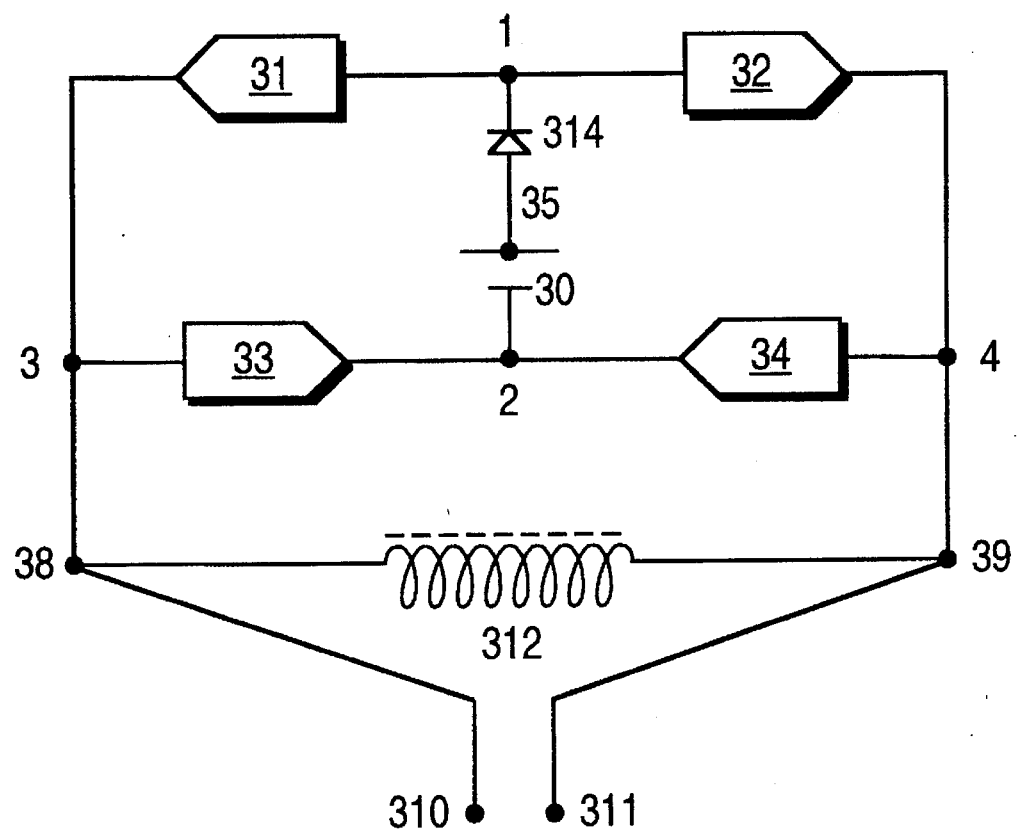
FIG. 6 is a schematic diagram of a STAC adaptor, a two-terminal package to be connected to the household ac line.

FIG. 6 shows the schematic diagram of an embodiment in accordance with the invention, showing the "bridge" configuration 1-2-3-4 having four directional switching units 31, 32, 33 and 34 and a transformer 312 connected such that the ac line power terminals 310, 311 can energize the transformer at 38 and 39, and energize the bridge at 3 and 4 while the solar cell ensemble described in FIGS. 2–4 is represented as a battery 30 connected in series with a diode 314 at 35 such that the negative terminal of the battery is connected to the bridge terminal 2 and the negative terminal of the diode is connected to the bridge terminal 1. The battery and the diode may exchange places in the series connection between terminals 1 and 2 with no operational difference.

FIG. 7 shows a schematic details of a directional switching unit comprising a silicon control rectifier (SCR) 315 and a coil 328 which is one of the secondary coils of the transformer 312 of FIG. 6, and said coil 328 is connected in parallel with the series combination of the diode 326 and resistor 327 at 318 and 322 while the negative terminal of 326 is connected to 327 at 320, to form a network connections across the gate 317 and cathode 316 of the SCR with a resistor between 317 and 318, finally forming the whole switching unit having positive electrode 313 at the anode of the SCR and the negative terminal 314 at the tie point of 316, 321 and 322.

It is understood that there are 3 more such switching units similarly constructed as shown appropriately connected in FIG. 6, with the coils similar to 328 as secondary coils of 312 but their phases arranged such that 31 and 34 are operated "ON" when 32 and 33 are "OFF", and vice versa.

Alternatively, the switching devices may comprise field effect transistors (FET), bipolar transistors, insolated-gate bipolar transistors (IGBT), gate-turn-off thyristors (GTO) or MOS-controlled thyristors (MCT).

FIG. 8 shows a schematic diagram of a possible alternate scheme of energizing the gate-cathode pair in lieu of the less complex diode-resistor network scheme for the same function depicted in FIG. 7, and it should be understood by those skilled in the art the additional merits therein.

Figure 9:
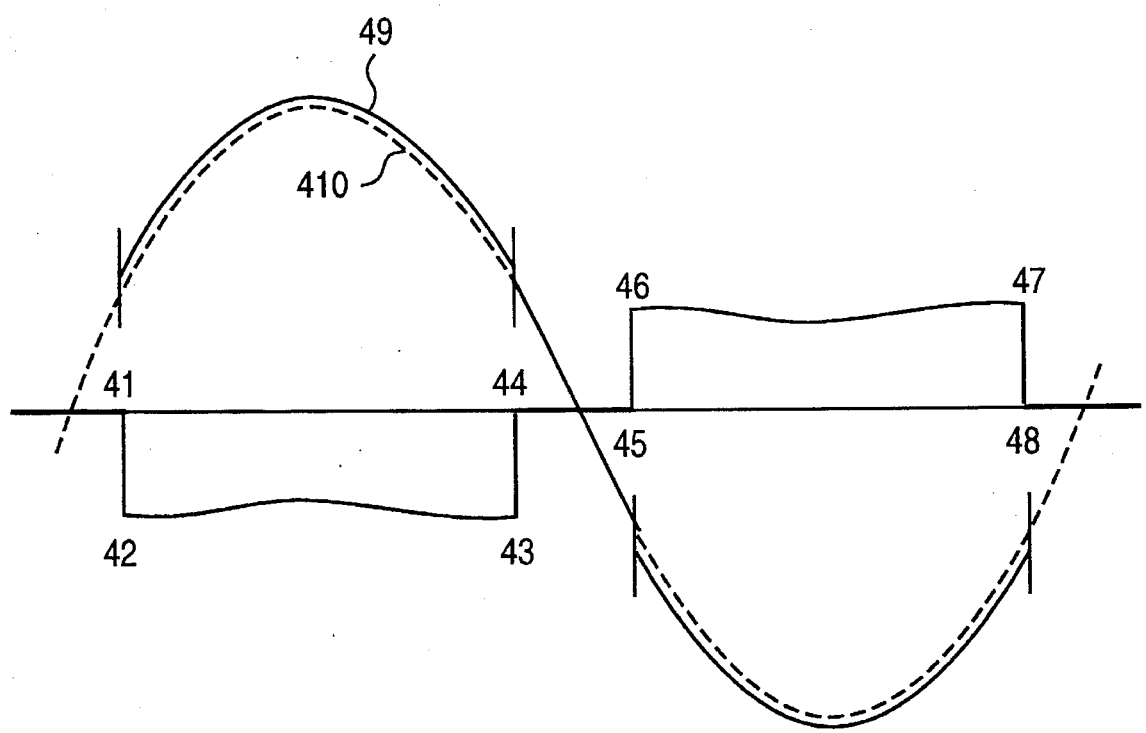
FIG. 9 is the current and voltage waveforms measured at the terminals of the STAC adaptor shown in FIG. 6.

FIG. 9 shows the ac line voltage 410 as dashed curve, the voltage between 1 and 2 of FIG. 6 as the piece-wise continuous curve 49, and the current waveform 41-42-43-44-45-46-47-48 between 3 and 4 of FIG. 6.

Referring now to FIGS. 2 and 3 it is evident that in principle any requirement on the magnitude of current could be met by paralleling a sufficient number of cells into a compound cell. From FIGS. 4 and 5 it is also evident that in principle any open-circuit voltage 21 can be obtained using sufficient number of compound cells in series to form the ensemble, which can also supply the desired short-circuit current 22. It is arranged that the sum total of the open-circuit voltage is 5–20% greater than the absolute value of the peak voltage of the ac. power line.

Furthermore, it is readily apparent to those skilled in the art that there are other series parallel combinations of the cells which can produce the same set of open circuit voltage and short circuit current.

Reference is now made to FIGS. 6 and 7. Evidently the points 310, 38 and 3 are electrically the same point. The gate-cathode biases of the switching units 31 and 34, although electrically isolated from each other, are both of the same phase as the ac voltage at the 310-38-3 common point. When this common point is positive (with respect to the other common point 311-39-4) the switching units 31 and 34 are conducting and 32, 33 are blocking. Under this condition, and because the open-circuit voltage 21 of the ensemble 30 is larger than the voltage at the 310-38-3 common point, there is a current of a value I given by the value on the curve in FIG. 5 at the instantaneous voltage value V of the common point flowing positively from 3 to 38 to 310 and negatively from 4 to 39 to 311.

Conversely when the common point 310-38-3 is negative the switching units 31 and 34 become blocking, while the units 32 and 33 are conducting, and the similar current I flows positively from 4 to 39 to 311 and negatively from 3 to 38 to 310.

The voltage and current described above appear graphically as 410 and 41-42-43-44-45-46-47-48 in FIG. 9. The secondary coils are connected so that the switching devices 31 and 34 have the same ac. phase, and similarly devices 32 and 33 have the same phase as each other. Devices 31 and 36 have phases which differ by 180° from the phase of devices 32. The voltage difference between 3 and 4, indicated by 49, corresponds to said current at any instant according to the I–V characteristic in FIG. 5.

FIG. 8 shows a schematic circuit diagram of a possible alternate scheme of energizing the gate-cathode pairs of the switching units. The circuit could be tailored to be more effective by one skilled in the art of controlling the SCR behaviours.

Finally it should be evident that the diode 314 in FIG. 6 serves to block any current from other parts of the circuit to flow into the solar cell ensemble 30. The STAC circuit in FIG. 6 therefore would only add ac power to the ac line when the cells are illuminated but will not absorb power from the line under insufficient illumination.

As a discrete package the invented circuit, to be called "Solar to AC" or STAC adaptor, comprises the transformer with four secondaries, the four SCR "units" (each with the appropriate gate drive network and driven by the transformer secondary voltage with appropriate phase) and the (safety) series diode. The package has one two-prong (35, 2) terminal to connect to the solar cell "battery" and one two-(or three-) prong (310, 311) plug to plug into the ac "house line". The STAC adaptor is thus a very simple, inexpensive, safe and self-operating, and highly efficient.

Inasmuch as the STAC current waveform resembles a "square" ac wave, the amplitude of the fundamental frequency wave, from Fourier analysis, is approximately $4/\pi$ times the "square height". And because modern loads, such as computers, often convert the ac house-power into dc power supplies needed for the electronics, the square-wave nature of STAC actually is more effective in terms of ac energy conversion into dc.

The STAC package can also be applied to any pair of ac lines and hence are suitable supplementary to the 3-phase power line as well (one STAC per pair of one phase) The STAC's may also be arranged to provide different amounts of supplemental current into different one-phase pairs of the three-phase lines, to meet the unequal demands of unbalanced loads often occurring in three-phase applications.

While it is true that the STAC adaptor will not absorb appreciable power from the ac line, small losses in the gate drive transformer and the possible danger of atmospheric electromagnetic pulse as a safety measure the STAC adaptor should be disconnected from the ac power line during night time. A separate automated control circuit to effect the disconnection could be designed into the STAC adaptor, but this is not included as part of the present invention.

From the description above it should be evident that the circuit differs from those in the state of the art in that it makes use of the current-source nature of the solar cell itself as the means to simplify the circuit and thus lowering the cost, and achieving the maximum efficiency.

In order to minimize costs and maximize the efficiency of solar energy utilization as supplementary AC power source a new "Solar to AC" or STAC adaptor makes use of the current-source nature of the solar cell, the highly efficient switching capability of the switching device such as the silicon-controlled rectifier (SCR), and the AC line phase itself. The newly invented STAC adaptor circuit is simple, inexpensive, self-regulated, safe and efficient.

While the invention has been particularly shown and described with reference to several preferred embodiments thereof, it will be understood by those skilled in the art that various changes in form and details may be made therein without departing from the spirit and scope of the invention.

References
1. Tamil, et al., Canadian Patent No. 1016998, issued 77/09/06, "Power Conversion Systems".
2. Butler, D. M., U.S. Pat. No. 4,075,034, Feb. 21, 1978, "Solar Converter".
3. Bobier, J. A., Brown, G. E., U.S. Pat. No. 4,742,291, May 3, 1988, "Interface Control for Storage Battery based alternate energy systems".

I claim:

1. A circuit for converting solar energy into ac power supplementary to household ac power, comprising the combination of:

a plurality of solar photovoltaic cells chosen to be as nearly identical as possible;

means for connecting said cells in parallel in one or more groups of a certain number of cells, each group having a group short-circuit current, such that when illuminated the group's short-circuit current exceeds a value of application interest;

means for connecting said groups of parallel-connected cells in series forming an ensemble such that the open-circuit voltage of the ensemble is 5–20% greater than an absolute value of a peak voltage of the household ac power;

four units of switching devices each of which can be operated to pass a current in one direction and having a positive and a negative electrode, the units being connected in a bridge configuration in which the positive electrodes of two units are electrically connected at a first terminal, the negative electrodes of the two other units are electrically connected at a second terminal, and in which one unit of said two units is connected to one unit of said other two units, through a third terminal, the other unit of said two units being connected to the other unit of said other two units through a fourth terminal;

means for connecting the ensemble comprising the series connected groups of parallel solar cells to said bridge with the positive voltage terminal of the ensemble connected to the first bridge terminal and the negative voltage terminal of the ensemble to the second bridge terminal;

an isolation transformer having a primary coil and a pair of input terminals and at least four low voltage secondary output coils which are isolated from one another and from the primary coil, each having a pair of output terminals;

means for connecting the third and fourth terminals of said bridge to the terminals of the primary coil of the transformer;

plug which can be plugged into the ac power line; and means for connecting the output terminals of each secondary coil across a pair of control electrodes of the switching devices such that in use the voltages on the control electrodes of the devices on the opposite arms of the bridge have the same ac phase as each other and a phase which is 180° different from the ac phase on the control electrodes of the other two switching devices on adjacent arms of the bridge.

2. A circuit as defined in claim 1, further comprising more than one isolation transformer, the primary coils of which are connected in parallel and the individual secondary coils serving to control respective switching devices.

3. A circuit as defined in claim 1, wherein the switching devices are silicon-controlled rectifiers (SCRs).

4. A circuit as defined in claim 3, further comprising a rectifier with appropriate voltage and current ratings connected in electrical series with said ensemble of solar cells, the series being connected between the first and second terminals of the bridge such that by rectification the current can only flow from the ensemble to the first terminal of the bridge.

5. A circuit as defined in claim 3, wherein "on" control signal for controlling each switching device is of low voltage high current type and an "off" control signal is of the high voltage low current type.

6. A circuit as defined in claim 1, wherein the switching devices are selected from the group comprising Field-Effect Transistors (FET), bipolar transistors, Insolated-Gate Bipolar Transistors (IGBT), Gate-Turn-Off Thyristors (GTO), and MOS-Controlled Thyristors (MCT).

7. A plurality of circuits, each as defined in claim 1, connected across pairs of lines of three-phase ac power lines, to provide supplementary power.

8. A plurality of circuits as defined in claim 7, arranged to provide different amounts of supplemental current into different one-phase pairs of the three-phase lines.

* * * * *